(12) United States Patent
Pramono et al.

(10) Patent No.: US 8,201,113 B2
(45) Date of Patent: Jun. 12, 2012

(54) METHOD AND APPARATUS FOR MULTI-DIE THERMAL ANALYSIS

(75) Inventors: Eddy Pramono, Santa Clara, CA (US); Yong Zhan, San Jose, CA (US); Vinod Kariat, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 854 days.

(21) Appl. No.: 12/180,490

(22) Filed: Jul. 25, 2008

(65) Prior Publication Data

US 2010/0023903 A1 Jan. 28, 2010

(51) Int. Cl.
   *G06F 17/50* (2006.01)

(52) U.S. Cl. ........ 716/100; 716/106; 716/110; 716/111; 716/132; 716/133

(58) Field of Classification Search .................. 716/100, 716/106, 110–111, 132–133
See application file for complete search history.

(56) References Cited

U.S. PATENT DOCUMENTS

| | | | |
|---|---|---|---|
| 6,842,714 B1 | 1/2005 | Acar et al. | |
| 6,895,354 B2 | 5/2005 | Matsuyama et al. | |
| 7,366,997 B1 | 4/2008 | Rahmat et al. | |
| 7,548,792 B2 | 6/2009 | Kumano et al. | |
| 7,626,144 B2 | 12/2009 | Merzliakov | |
| 2004/0073397 A1 | 4/2004 | Matsuyama et al. | |
| 2005/0044515 A1 | 2/2005 | Acar et al. | |
| 2005/0102117 A1 | 5/2005 | Habitz | |
| 2006/0039114 A1 | 2/2006 | Hamann et al. | |
| 2006/0095493 A1 | 5/2006 | Kumano et al. | |
| 2007/0168151 A1 | 7/2007 | Kernahan et al. | |
| 2007/0206654 A1 | 9/2007 | Merzliakov | |
| 2007/0244676 A1 | 10/2007 | Shang et al. | |
| 2008/0026493 A1 | 1/2008 | Shakouri et al. | |
| 2008/0072182 A1 | 3/2008 | He et al. | |
| 2008/0087478 A1 | 4/2008 | Stalford | |
| 2008/0168406 A1* | 7/2008 | Rahmat et al. ..................... 716/2 |
| 2008/0183322 A1 | 7/2008 | Kumano et al. | |
| 2008/0244278 A1 | 10/2008 | Monferrer et al. | |
| 2009/0024969 A1 | 1/2009 | Chandra | |
| 2009/0111215 A1 | 4/2009 | Caron et al. | |
| 2009/0199140 A1 | 8/2009 | Kariat et al. | |
| 2009/0319964 A1 | 12/2009 | Kariat et al. | |
| 2009/0319965 A1 | 12/2009 | Kariat et al. | |

OTHER PUBLICATIONS

Updated portions of prosecution history of U.S. Appl. No. 12/144,651, Jan. 11, 2011 Kariat, Vinod, et al.
Portions of prosecution history of U.S. Appl. No. 12/416,793, Jan. 5, 2011, Karait, Vinod, et al.
Portions of prosecution history of U.S. Appl. No. 12/024,002, Feb. 8, 2010, Vinod Kariat, et al.

(Continued)

*Primary Examiner* — Paul Dinh
(74) *Attorney, Agent, or Firm* — Adeli & Tollen LLP

(57) ABSTRACT

Some embodiments of the invention provide a method for performing thermal analysis of a multi-die integrated circuit (IC) design layout. The thermal analysis produces a temperature distribution for analyzing internal properties of each die within the multi-die design and for analyzing thermal interactions between two or more dies of the design based on an internal configuration of the two or more dies. Therefore, in some embodiments, the temperature distribution shows a temperature distribution for each die and the individual temperature distribution show varying temperature across each of the dies. Some embodiments reduce the number of iteration required to perform the thermal analysis by constructing a high quality preconditioner based on thermal conducting segments introduced to model thermal effects at the boundaries between two dies.

20 Claims, 14 Drawing Sheets

OTHER PUBLICATIONS

Zienkiewicz, O.C., "The Finite Element Method" 3$^{rd}$ ed., 1977, pp. 423-449, McGraw-Hill Book Company (UK) Limited, Berkshire, England.
Final Office Action of U.S. Appl. No. 12/024,002, May 12, 2010, Vinod Kariat, et al.
Updated Portions of prosecution history of U.S. Appl. No. 12/024,002, Dec. 9, 2010, Kariat, Vinod et al.
Portions of prosecution history of U.S. Appl. No. 12/144,651, Oct. 25, 2010, Kariat, Vinod, et al.
Updated portions of prosecution history of U.S. Appl. No. 12/024,002, May 9, 2011, Kariat, Vinod, et al.
Updated portions of prosecution history of U.S. Appl. No. 12/144,651, May 10, 2011, Kariat, Vinod, et al.
Updated portions of prosecution history of U.S. Appl. No. 12/416,793, May 5, 2011, Kariat, Vinod, et al.
Goplen, Brent, et al., "Thermal Via Placement in 3D ICs", Proceedings of the 2005 International Symposium on Physical Design (ISPD'05), Apr. 3-6, 2005, pp. 167-174, ACM, San Francisco, CA, USA.
Updated portions of prosecution history of U.S. Appl. No. 12/024,002, Jul. 21, 2011, Kariat, Vinod, et al.
Updated portions of prosecution history of U.S. Appl. No. 12/144,651, Jun. 10, 2011, Kariat, Vinod, et al.
Updated portions of prosecution history of U.S. Appl. No. 12/416,793, Jul. 21, 2011, Kariat, Vinod, et al.

* cited by examiner

METHOD AND APPARATUS FOR MULTI-DIE THERMAL ANALYSIS

FIELD OF THE INVENTION

Some embodiments of the invention provide a method for performing thermal analysis of a multi-die integrated circuit design.

BACKGROUND OF THE INVENTION

An integrated circuit ("IC") is a device (e.g., semiconductor device) that includes many electronic components, such as transistors, resistors, diodes, etc. These electronic components can be connected together to form multiple circuit components such as gates, cells, memory units, arithmetic units, controllers, decoders, etc. An IC includes multiple layers of wiring that interconnect its electronic and circuit components.

Design engineers design an IC by transforming logical or circuit descriptions of the IC's components into geometric descriptions, called layouts. IC layouts typically include (1) circuit modules (i.e., geometric representations of electronic or circuit IC components) with pins, and (2) interconnect lines (i.e., geometric representations of wiring) that connect the pins of the circuit modules.

To create layouts, design engineers often use electronic design automation ("EDA") applications. These applications provide sets of computer-based tools for creating, editing, and analyzing IC design layouts. Examples of such tools include (1) standard cell libraries that provide numerous cells that can be instantiated as circuit modules in a design, (2) placement tools that define the location of the various circuit modules in a layout, (3) routing tools that define the wiring between the circuit modules, and (4) verification tools that verify that the designed layout will meet design operation requirements.

One type of verification tools are thermal analysis tools. Prior thermal analysis tools dealt mostly with the thermal properties of the IC packages and often ignored thermal properties on the IC. These prior tools were mainly concerned about the total power dissipation of the IC, and about whether a specific package was sufficient to cool a given IC. As a result, the IC often was treated as a lumped heat source, while the model for the package was very detailed, including details regarding airflow around the package.

In recent years, the emergence of multi-die IC designs has created a greater need for on-chip thermal analysis. Multi-die IC designs incorporate two or more dies (i.e., wafers) within a single integrated circuit (IC). Some benefits of multi-die IC designs include providing greater functionality in a smaller space and operating at faster speeds as the multiple dies are located within the same package and therefore suffer less propagation delay than two dies in two separate packages.

Logically, each die within a multi-die IC design may act as a different processing unit, digital signal processor (DSP), or system-on-a-chip (SoC) with each die being comprised of multiple circuit modules, interconnects, etc. Physically, these dies can be configured in several different arrangements (e.g., horizontal arrangement of dies or vertically stacked dies) within a single package. Each arrangement produces a different temperature distribution with each temperature distribution useful in determining the operational viability of the configuration within the real world.

Creating a functional multi-die design requires the design to not only successfully perform the operations specified in the design, but the design must also overcome the real world physical constraints that determine the viability of the design within the real world. One such physical constraint includes the heat constraint which if exceeded could result in a malfunction, electrical damage, or physical damage to the components (e.g., circuits) of the IC that implement the design.

Heat is byproduct of the current traversing the various circuits of the IC. A major contributor to the resulting heat generated by the design is the amount of leakage current. As illustrated in FIG. 1, leakage current is greatly affected by on-chip temperature variations. In fact, a circular dependency exists between the on-chip temperature, leakage current, and power dissipation. As illustrated in FIG. 2, the leakage current 210 affects the power dissipation 215. As the leakage current 210 rises, the power dissipation 215 also rises along with it. The power dissipation 215 increases the temperature 205, which in turn increases the leakage current 210. This circular set of dependencies creates the potential for a runaway feedback loop in which the temperature of the IC continually increases with the leakage current.

By producing on-chip thermal models for a multi-die IC design, layout designers will have additional means to overcome the heat constraint. Specifically, a multi-die IC design may satisfy or violate the heat constraint depending on how the different dies are configured within a particular package. As noted above, each configuration produces a different thermal signature. For instance, each die in a horizontally arranged die configuration may experience equal amounts of heat dissipation through the package thus producing a first thermal signature, whereas the same dies in a vertically stacked configuration will include some dies located further away from the package with the heat generated from these dies being more difficult to dissipate, thus producing a second thermal signature. Each such thermal signature can then be used to determine how cool and how fast a multi-die design is capable of operating. Additionally, accurate thermals signatures for multi-die designs identify thermal problems early in the design cycle. By being able to detect the thermal problems, layout designers will be able to select an optimal configuration and therefore better account for the heat constraint at design time.

Accordingly, there is a need to perform thermal analysis to model the thermal interaction between the multiple dies of a multi-die design. Moreover, there is a need to efficiently perform such multi-die thermal analysis. Such efficient analysis should reduce the amount of memory and processing resources that would otherwise be consumed when aggregating thermal models that were individually computed for each die of the multi-die IC design.

SUMMARY OF THE INVENTION

Some embodiments of the invention provide a method for performing thermal analysis of a multi-die integrated circuit (IC) design layout. The thermal analysis produces a temperature distribution for analyzing internal properties of each die within the multi-die design and for analyzing thermal interactions between two or more dies of the design based on an internal configuration of the two or more dies. Therefore, in some embodiments, the temperature distribution shows a temperature distribution for each die and the individual temperature distributions show varying temperature across each of the dies.

In some embodiments, performing the thermal analysis identifies thermal effects at two or more locations along each die. Some embodiments use thermal elements to model the thermal effects at the locations. Specifically, some embodiments define internal thermal elements for modeling the internal thermal properties of a die and boundary thermal elements for modeling the thermal interdependencies between two or more neighboring dies. In some embodiments, virtual segments are introduced at the boundary thermal elements to abstractly model thermal effects at the contact points between two dies.

Some embodiments construct a set of equations representing the thermal model of each particular die based on the thermal elements for the particular die. Some embodiments then combine the individual thermal models of each die to derive an overall heat flow equation for the multi-die design that when solved shows a temperature distribution for each die in the design. To facilitate the solving of the overall heat flow equation, some embodiments apply a preconditioner to the overall heat flow equation. In some embodiments, the preconditioner is constructed from a set of preconditioners derived from a factorization of the thermal models of each die.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

In the following description, numerous details are set forth for the purpose of explanation. However, one of ordinary skill in the art will realize that the invention may be practiced without the use of these specific details. In other instances, well-known structures and devices are shown in block diagram form in order not to obscure the description of the invention with unnecessary detail.

I. Overview

Some embodiments of the invention provide a method for performing thermal analysis of a multi-die integrated circuit (IC) design layout. The thermal analysis produces a temperature distribution for analyzing internal properties of each die within the multi-die design and for analyzing thermal interactions between two or more dies of the design based on an internal configuration of the two or more dies. Therefore, in some embodiments, the temperature distribution shows a temperature distribution for each die and the individual temperature distributions show varying temperature across each of the dies.

Figure 1:
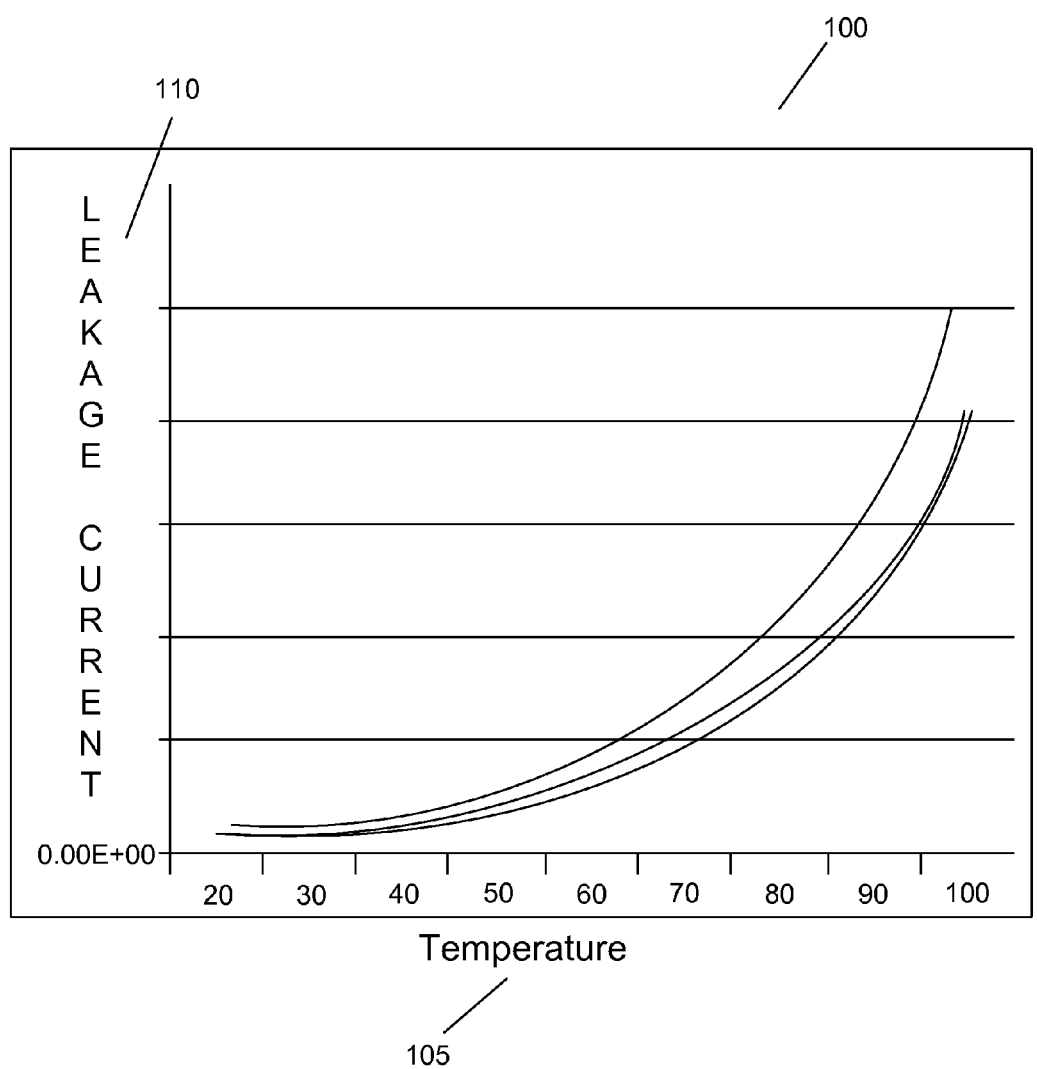
FIG. 1 illustrates that leakage current is greatly affected by on-chip temperature variations.
Figure 2:
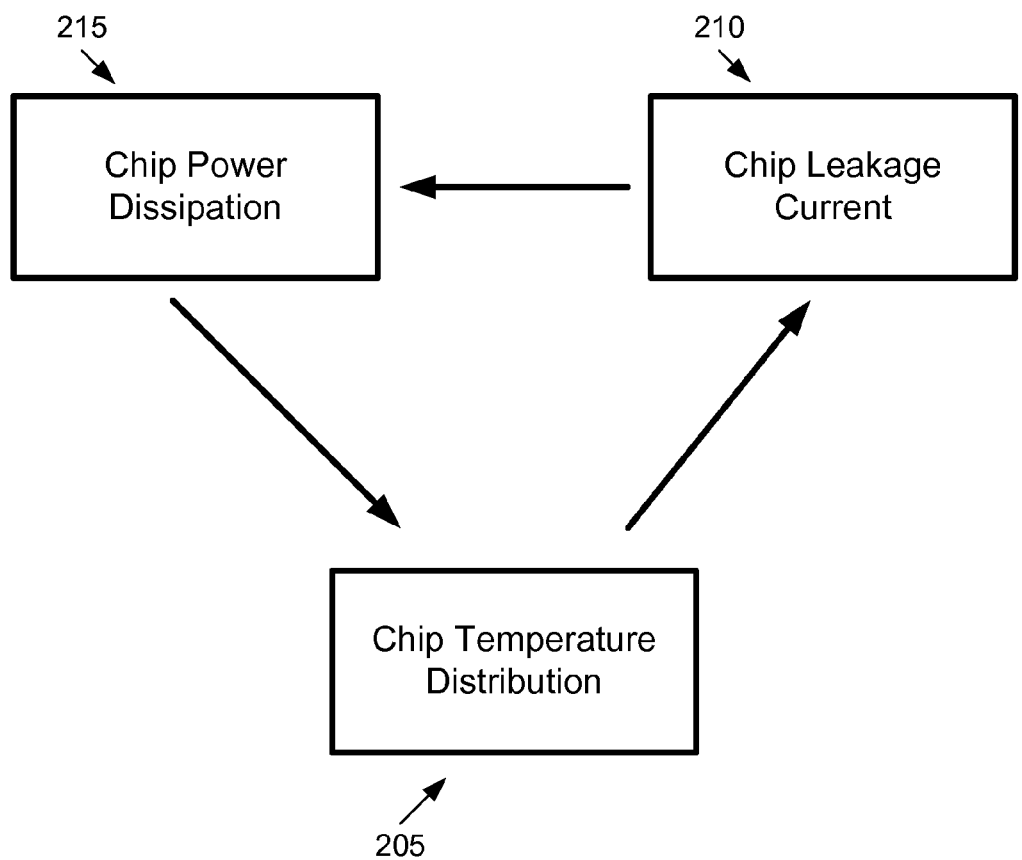
FIG. 2 illustrates that the leakage current affects the power dissipation
Figure 3:
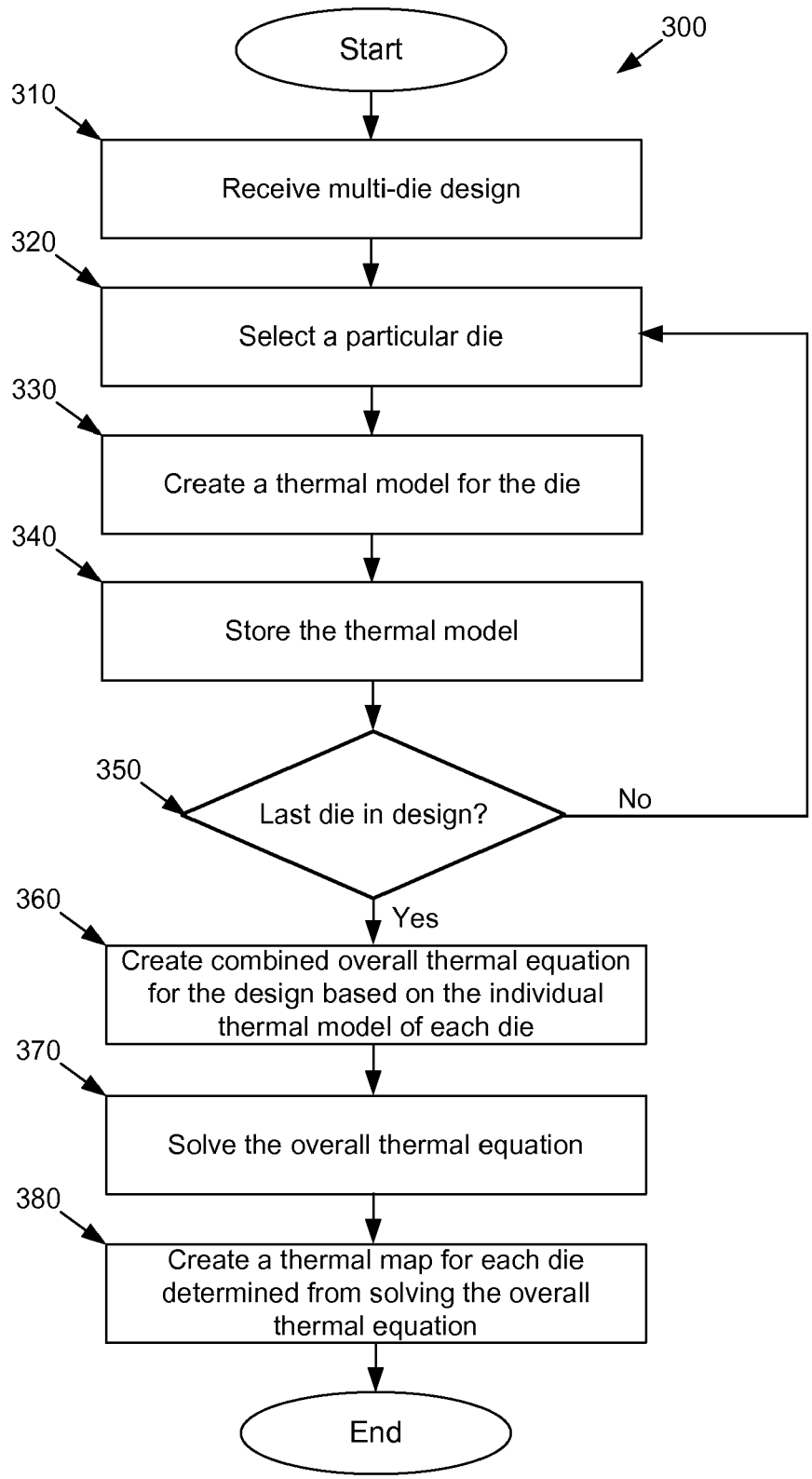
FIG. 3 presents a process performed by some embodiments of the invention to perform the thermal analysis of a multi-die IC design.

FIG. 3 presents a process 300 performed by some embodiments of the invention to perform the thermal analysis of a multi-die IC design. The process 300 begins by receiving (at 310) a multi-die design specifying a particular configuration for the dies in the design. The process partitions (at 320) the multi-die IC design by selecting individual dies within the design to preprocess. During preprocessing, some embodiments derive (at 330) a set of equations that represent a thermal model for the preprocessed die. To derive the set of equations, some embodiments model thermal properties within each die and between different dies by defining a set of thermal elements. Specifically, some embodiments define internal thermal elements to model the internal thermal properties of a die and boundary thermal elements to model the thermal interdependencies between two or more neighboring dies.

In some embodiments, defining the thermal elements includes defining multiple nodes throughout the die. The nodes facilitate determining the thermal models within each die and between different dies. In some embodiments, the defined nodes are vertices of three-dimensional bricks that divide the die's design layout. Each node represents a space within or around the die that accounts for the thermal effects (e.g., heat flow) of one or more thermal sources within the defined space over multiple dimensions. For instance, a node may experience heat flow from an x-axis, y-axis, and/or z-axis of a three-dimensional space. Accordingly, internal nodes account for thermal effects from thermal sources particular to a single die, whereas boundary nodes account for thermal effects from thermal sources both internal to and external to a given die.

Other embodiments utilize virtual segments as the thermal elements to model the thermal effects at contact points between two discrete abutting surfaces (e.g., two or more neighboring dies). Virtual segments represent highly conductive abstract connections that account for the thermal effects at the contact points over a single dimension. In some embodiments, virtual segments represent an extrapolation of a boundary node at contact points between first and second dies. Specifically, a boundary node is logically extrapolated into a first internal node of the first die, a second internal node of the second die, and a virtual segment to account for the thermal effects at the contact point previously represented by the boundary node.

Together the internal nodes with the boundary nodes or virtual segments form a set of equations that expresses the temperature dependence of the power dissipation for several circuit modules of a particular die. The thermal model for the die is then stored (at 340) as the process proceeds (at 350) to preprocess the next die within the design until all dies in the multi-die IC design have been preprocessed.

The process then combines (at 360) the equations from each die to produce an overall heat flow equation that expresses a temperature distribution for the entire multi-die design layout. Some embodiments iteratively solve (at 370) the overall heat flow equation to converge the sets of equations to a solution that satisfies a particular steady state threshold.

In some embodiments, the number of iterations needed to converge to the steady state solution is reduced by applying a preconditioner that is derived from each die to the overall heat flow equation. The preconditioner is a mathematical construct generated during preprocessing to assist in the convergence of the set of equations to the steady state solution. Some embodiments derive the preconditioner from a set of known thermal properties for a given die.

The solution of the overall heat flow equation produces (at 380) a temperature distribution for the entire multi-die design that is dependent upon the configuration of the dies within the multi-die design and the thermal interactions occurring at the contact points between neighboring dies. In some embodiments, the resulting temperature distribution includes thermal maps for each die in the multi-die design. Some embodiments then utilize the resulting temperature distribution to determine the viability of a particular configuration for two or more dies of a multi-die design within a particular package. Also from the resulting temperature distribution, some embodiments determine a configuration that yields an optimal temperature distribution for a particular package.

Several more detailed embodiments are described in the sections below. Specifically, Section II describes preprocessing where the multi-die IC design is partitioned into more manageable sub-components. Next, Section III describes the construction and solving of the overall heat flow equation for the entire multi-die IC design. Lastly, Section IV provides a description of a system architecture with which some embodiments are implemented.

II. Preprocessing

A. Overall Flow

Figure 4:
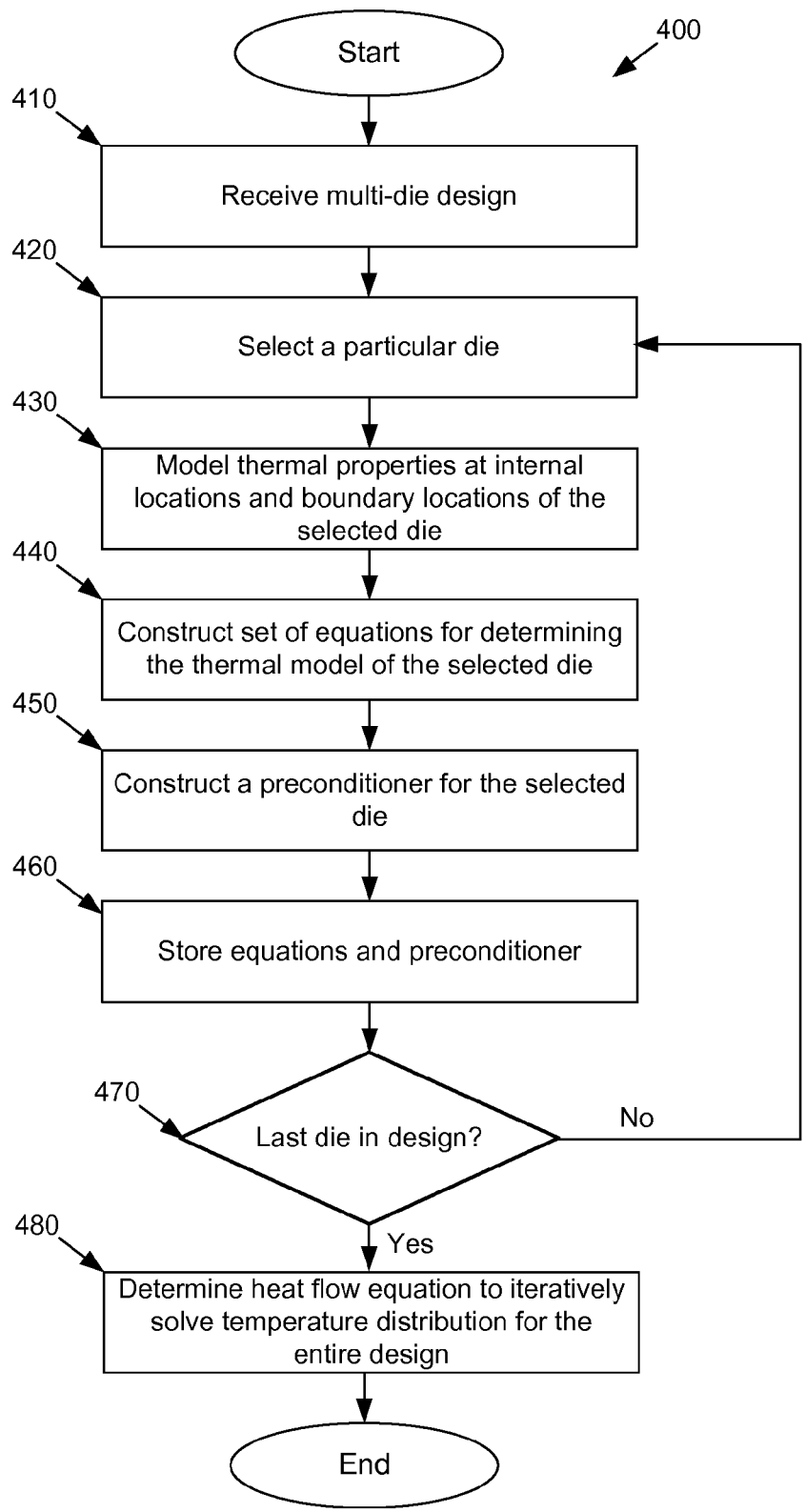
FIG. 4 presents a process for deriving the heat flow equation for an entire multi-die design through a partitioning of the multi-die IC design.

As mentioned above, some embodiments perform the thermal analysis by partitioning the multi-die IC design to select individual dies within the design to preprocess. The partitioning divides the complex calculation for computing the temperature distribution of the entire multi-die IC design into more manageable sub-components. FIG. 4 presents a process 400 for deriving the heat flow equation for an entire multi-die design through a partitioning of the multi-die IC design.

The process 400 begins by receiving (at 410) the multi-die IC design. The process 400 partitions the multi-die design by selecting (at 420) a particular die from the multi-die design to preprocess. In some embodiments, preprocessing proceeds by modeling (at 430) thermal properties (e.g., power dissipation, leakage current, temperature, etc.) at various locations along the selected die to derive the individual set of equations that produce the thermal model for the selected die. Specifically, a die includes (1) internal locations where the thermal effects from sources outside the selected die do not directly influence the thermal model at such internal locations and (2) boundary locations where the thermal effects from sources outside the selected die directly influence the thermal model at such boundary locations.

Some embodiments define nodes and/or virtual segments to compute thermal models at specified internal and boundary locations. In this manner, some embodiments reduce the number of computations required to generate the thermal model, thus avoiding having to continually compute thermal effects over the entire area of the preprocessed die. Moreover, depending on the number of nodes and virtual segments used within the computations, some embodiments are able to modify the accuracy and detail of the generated thermal models. Such modifications can be based on available computing resources or a user's preference. A more detailed description of nodes and virtual segments is provided below in Subsection II B.

The process 400 then uses the models derived from the thermal properties to construct (at 440) the set of equations. In some embodiments, the set of equations (1) computes parameters of non-linear equations that represent the leakage power dissipation of each particular circuit module and (2) expresses the on-die temperature in terms of the die's power consumption. Deriving the set of equations is further explained in the United States Patent Application entitled "Method and Apparatus for Thermal Analysis" with United States Patent publication number 2009/0199140 filed on Jan. 31, 2008, now issued as U.S. Pat. No. 8,104,006 which is incorporated herein by reference.

To expedite the solving of the set of equations, some embodiments determine (at 450) a preconditioner. Specifically, a preconditioner is a mathematical construct for assisting in the solving of linear systems with ill-conditioned matrices where a small change in a coefficient of one matrix results in a large change in the solution vector. A set of equations with ill-conditioned matrices often requires multiple iterations to converge to a steady state solution vector. The preconditioner reduces the condition number for the ill-conditioned matrices, thus allowing for quicker convergence to the steady state solution vector. Some embodiments derive the preconditioner from a set of known thermal properties within the set of equations for a given die. In some embodiments, this is accomplished by factorizing particular matrices within the set of equations. Deriving the preconditioner from the set of equations is described in further detail below in Subsection II C.

The process 400 stores (at 460) the preprocessed data (i.e., the set of equations and the corresponding preconditioner) for later retrieval when solving the heat flow equation for the entire system. The process then checks (at 470) whether other dies within the multi-die design have yet to be preprocessed. If more dies remain, the process reverts to step 420 and selects the next die for preprocessing. If no other dies remain, the process derives (at 480) an overall heat flow equation from the preprocessed information to iteratively solve the temperature distribution for the entire multi-die IC design.

B. Nodes and Virtual Segments

Some embodiments derive the set of equations by defining nodes and/or virtual segments to model the thermal effects at various internal and boundary locations of a particular die. In some embodiments, the defined nodes are vertices of three-dimensional bricks that divide the die's design layout. Each node represents a space within or around the die that accounts for the thermal effects (e.g., heat flow) of one or more thermal sources within the defined space over multiple dimensions.

Some nodes (i.e., internal nodes) define a space within the preprocessed die that models the thermal effects from thermal sources falling within the defined space. The thermal effects from the thermal sources falling within the defined space include thermal effects from circuit elements, wiring, or thermal vias (i.e., through silicon vias) as some examples. Other nodes (i.e., boundary nodes) define a space at a boundary of the preprocessed die that models the thermal effects from thermal sources both internal to and external to the preprocessed die falling within the space defined by the boundary node. The thermal effects from external thermal sources include thermal effects from one or more neighboring dies or the thermal effects from the package.

The space defined by these nodes includes a multi-dimensional space. As such, each node will incorporate thermal effects occurring over the multiple dimensions. For a node defining a three dimensional space, the node accounts for thermal contributions occurring over an x-axis, y-axis, and z-axis of the three dimensional space. In this manner, a single node can model the heat flowing vertically away from the space defined by the node, the heat flowing vertically into the space defined by the node, and the heat flowing across a horizontal plane from neighboring circuit modules within the node's space. The United States Patent Application entitled "Method and Apparatus for Thermal Analysis" with United States Patent publication number 2009/0319964 filed on Jun. 24, 2008, now issued as U.S. Pat. No. 8,104,007 provides further description for defining a thermal model for a particular die and is incorporated herein by reference.

Figure 5:
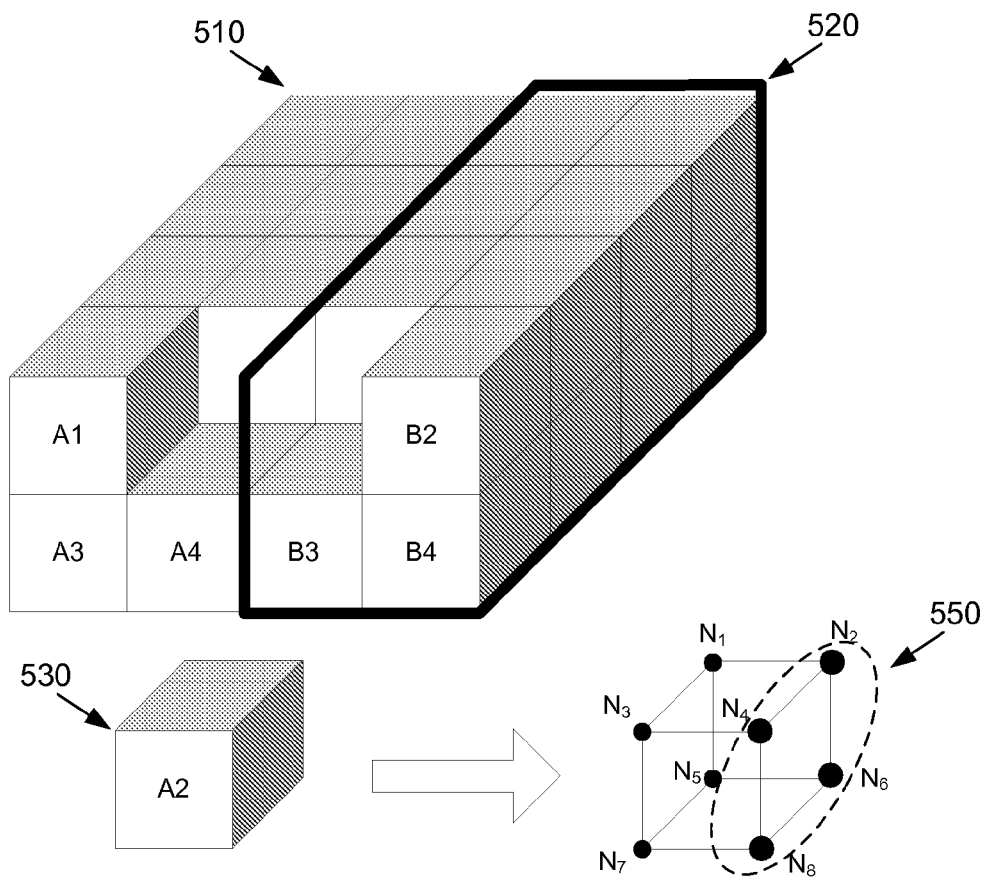
FIG. 5 illustrates internal nodes and shared boundary nodes for bricks of a first chip a neighboring second chip.

FIG. 5 illustrates internal nodes and boundary nodes for bricks of neighboring dies, where a brick represents an abstract cross segment of a die. Specifically, a first die 510 includes bricks labeled A1, A2, A3, and A4 with brick A2 530 extracted to illustrate internal nodes and boundary nodes 550 associated with the brick A2 530. FIG. 5 also includes a second die 520 that includes bricks labeled B1, B2, B3, and B4 with brick B1 540 extracted to illustrate internal nodes and boundary nodes 560 associated with the brick B1 540.

In this figure, an internal node, such as node N5 of brick 530, is a node that directly receives thermal contributions from thermal sources within die 510. The boundary nodes 550 (i.e., nodes N2, N4, N6, and N8) and 560 (i.e., nodes N9, N11, N13, and N15) are nodes where heat may be transferred from die 510 to 520 and vice versa over multiple dimensions. For instance, boundary node N2 of brick 530 may receive thermal contributions from node N9 along a first dimension, node N4 along a second dimension, and node N6 along a third dimension. It should be apparent to one of ordinary skill in the art that the boundary node N2 may also include thermal contributions from other nodes of the depicted bricks 530 and 540 and from other nodes of other bricks that are not extracted in FIG. 5.

In place of or in conjunction with boundary nodes, some embodiments utilize virtual segments to facilitate determining the thermal models at the boundaries of the preprocessed die. Virtual segments represent abstract thermal conducting connections that account for thermal effects at contact points between two or more discrete abutting surfaces (e.g., two or more neighboring dies) over a single dimension.

Figure 6:
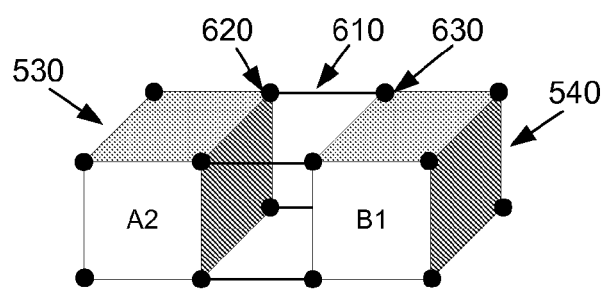
FIG. 6 illustrates internal nodes and virtual segments between a brick of a first chip and a brick of neighboring second chip.

FIG. 6 illustrates internal nodes and virtual segments 610 between the brick 530 of die 510 and the brick 540 of die 520. As in FIG. 5, the internal nodes for bricks 530 and 540 are those nodes whose thermal properties are not directly affected by thermal properties of nodes for neighboring dies or the package. However instead of boundary nodes, FIG. 6 introduces one or more virtual segments 610 at various contact points between the two dies 510 and 520.

In some embodiments, virtual segments represent an extrapolation of a boundary node at contact points between first and second dies. For instance, in FIG. 6, a single boundary node could be used to represent nodes 620 and 630. However, some embodiments logically extrapolate the boundary nodes into a first internal node 620 of a first die, a second internal node 630 of a second die, and a virtual segment 610 to account for the thermal effects at the contact point previously represented by the boundary node. In this manner, some embodiments remove the complexities associated with incorporating boundary nodes into the thermal model of a die, thus making the overall heat flow equation easily parallelizable. Additionally, the virtual segments facilitate the creation of high quality preconditioners that reduce the number of iterations needed to solve the heat flow equation and reach a steady state solution.

It should be apparent to one of ordinary skill in the art that the single dimensional nature of the virtual segment results in little to no accuracy lost in the thermal model of the die. This is because physically there is no cross sectional area introduced between the dies as a result of the virtual segment even though logically it appears this way in FIG. 6. As a result, virtual segments simplify the modeling of the thermal effects between different dies.

C. Heat Flow Equation Per Die

Together the internal nodes with the boundary nodes or virtual segments form a heat flow equation that expresses the temperature dependence of the power dissipation for several circuit modules of a particular die. In some embodiments, the heat flow equation for each die is expressed as $$C*T=P(T) \tag{1}$$

In this equation, C is a conductivity matrix that expresses the estimated conductivity for nodes and virtual segments of a particular die, T is a temperature vector that expresses the estimated temperature (i.e., temperature distribution) for the nodes and virtual segments of the particular die, and P(T) is a vector that is related to the estimated power consumption (i.e., power density) of the nodes and virtual segments of the particular die.

Different embodiments express the conductivity matrix C and power-related vector P(T) of equation (1) differently. Below is one finite-element formulation for the problem where the identified nodes of FIG. 5 are used to express the conductivity matrix C, compute the power-related vector P(T), and calculate the temperature vector T. Other embodiments might formulate C and P(T) differently for the heat flow equation (1). Yet other embodiments might use different heat flow equations than equation (1).

Some embodiments express the finite element formulation of the heat flow equation (1) by specifying the conductivity matrix C as:

$$C_{ij} = \int_\Omega \nabla^T N_i k \nabla N_j d\Omega + \int_{\Gamma_q} N_i h N_j d\Gamma_q \tag{2}$$

and the power-related vector P(T) as:

$$P_i(T) = \int_\Omega N_i g(x, y, z, T) d\Omega - \int_{\Gamma_q} N_i f d\Gamma_q. \tag{3}$$

Figure 7:
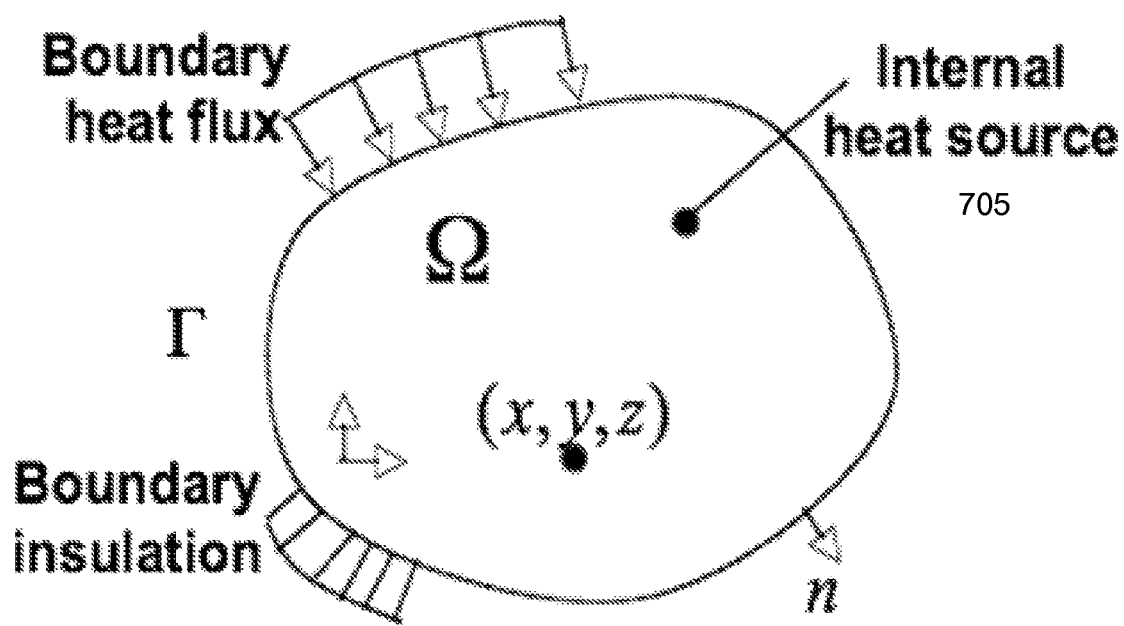
FIG. 7 illustrates a conceptual diagram of a heat source within a domain.

In these equations, $\Omega$ is the multi-layer IC design volume where the temperature distribution is to be computed, $\Gamma_q$ is the boundary where the boundary condition is applied, as illustrated in FIG. 7, i and j are nodes in the volume,
$N_i$ is the shape function associated with node i,
x, y, and z are point coordinates in the region,
T is temperature,
t is time,
g(x,y,z,T) is the steady state power density of a heat source 705 as the point heat source illustrated in FIG. 7,
k(x,y,z,T) is the thermal conductivity,
h is the heat transfer coefficient on the boundary through a specified package model to the ambient environment, and
f is $h*T_a$, where $T_a$ is the ambient temperature.

The steady-state power density term g(x,y,z,T) can be written as:

$$g(x,y,z,T)=g_i(x,y,z,T)+g_s(x,y,z,T)+g_l(x,y,z,T) \quad (4)$$

where $g_i(x,y,z,T)$ is the steady-state internal power density, $g_s(x,y,z,T)$ is the steady-state switching power density, and $g_l(x,y,z,T)$ is the steady-state leakage power density. Of these three power consumption components, $g_i$, $g_s$, and $g_l$, some embodiments only treat the leakage power consumption $g_l$ as temperature dependent. Other embodiments might also treat the switching power consumption and/or internal power consumption as temperature dependent. These finite element equations (2)-(4) are derived by discretizing the steady state heat flow equation using specified boundary conditions.

To expedite the solving of the set of equations some embodiments determine a corresponding preconditioner for the set of equations. In some embodiments, the preconditioner is chosen such that $P^{-1} \approx Z^{-1}$ where $P^{-1}$ is the preconditioning matrix and Z is a matrix within the linear system, such as the conductivity matrix C. Ideally, a preconditioner is derived such that $(P^{-1}*Z)=I$, where I is the identity matrix. Therefore, the accuracy of the preconditioner depends on its likeness to the matrix $Z^{-1}$. It should be apparent to one of ordinary skill in the art that the preconditioner of some embodiments may take one of several forms such as the Jacobi preconditioner where the preconditioner is defined only along the diagonal of the matrix or the Successive Over Relaxation (SOR) preconditioner.

Some embodiments construct the preconditioner $P^{-1}$ by leveraging information that was realized during the derivation of the set of equations. The conductivity matrix C within equation (1) is one such matrix within the set of equations that may be leveraged to construct the preconditioner. To derive the preconditioner from the conductivity matrix C, some embodiments perform a Cholesky factorization of the matrix C for each die. The Cholesky factors are then stored within a data structure. These stored values are for subsequent retrieval during the formulation of the overall heat flow equation used in performing the steady-state thermal analysis of all dies within the multi-die IC design.

However, constructing the conductivity matrix C and its inverse is often complicated by the interdependencies at the boundary nodes. By ignoring the boundary nodes and including only the internal nodes within the preconditioner construction, some embodiments are able to efficiently construct a relatively accurate preconditioner.

Figures 8, 9:
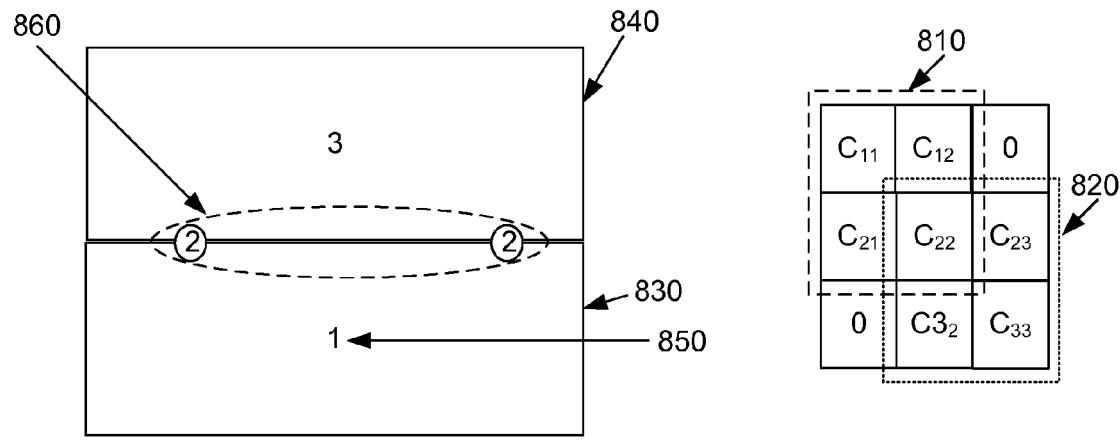
FIG. 8 illustrates a conductivity matrix for a chip that contains internal nodes and boundary nodes in accordance with some embodiments.
FIG. 9 illustrates a preconditioner derived from the internal nodes of the conductivity matrix of FIG. 8.

FIG. 8 illustrates a conductivity matrix 810 for die 830 and a conductivity matrix 820 for die 840. Die 830 contains internal nodes 850 and boundary nodes 860 that are shared with die 840. The conductivity matrix 810 is complete in the sense that it accounts for conductivity from the internal nodes 850 and from each of the boundary nodes 860. However, it should be apparent that the internal nodes 850 are the largest single factor determining the conductivity of the die 830. Moreover, the conductivity of the internal nodes 850 may be accurately determined during the preprocessing of the die 830 whereas the conductivity at the boundary nodes 860 requires that at least die 840 also be preprocessed. Therefore, to simplify the computation of the preconditioner, some embodiments account only for the internal nodes 850 in order to construct a relatively accurate preconditioner.

FIG. 9 illustrates a preconditioner matrix 910 that is created using simplified conductivity matrices. To obtain this preconditioner matrix, some embodiments simplify the conductivity matrices of dies 830 and 840 by extracting the sub-matrices C11 and C33 that account for the internal nodes of the dies. Some embodiments then invert (i.e., factorize) the simplified conductivity matrix for each die 820 and 840 and use the result to form an overall preconditioner matrix 910 for the entire multi-die design, as shown in FIG. 9. In some embodiments, the inversion of the sub-matrices C11 and C33 are implemented as Cholesky factorization of the matrices. In this manner, the preconditioner is determined without performing computations (i.e., inversion operations) for the boundary nodes.

Some embodiments increase the accuracy of the preconditioner derived from ignoring the boundary nodes by accounting for one or more virtual segments in the derivation of the preconditioner. In this manner, some embodiments are able to construct a more accurate preconditioner that further reduces the number of iterations and thus the convergence time when solving the overall heat flow equation.

Figure 10:
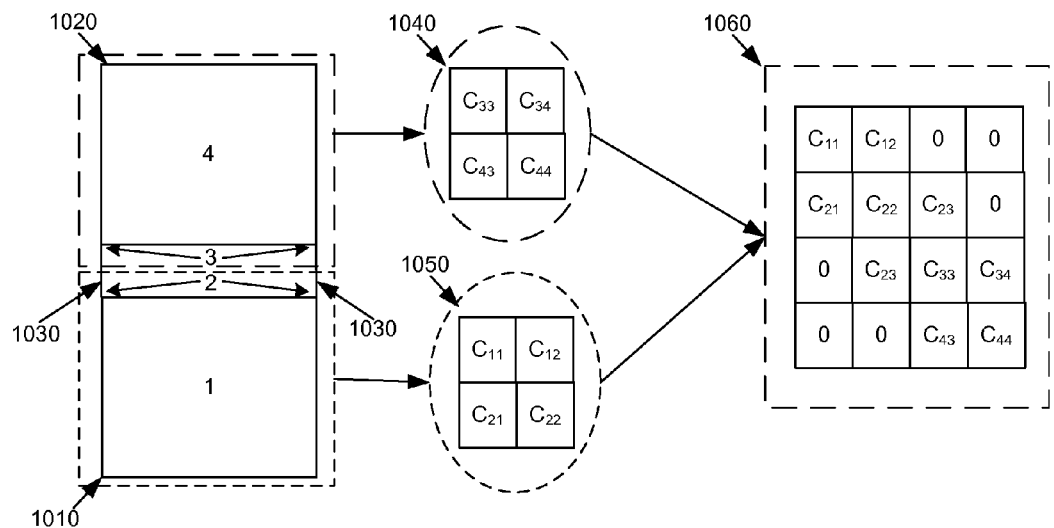
FIG. 10 illustrates the multi-die design of FIG. 8 and its corresponding conductivity matrix, but with the boundary nodes replaced with virtual segments.
Figure 11:
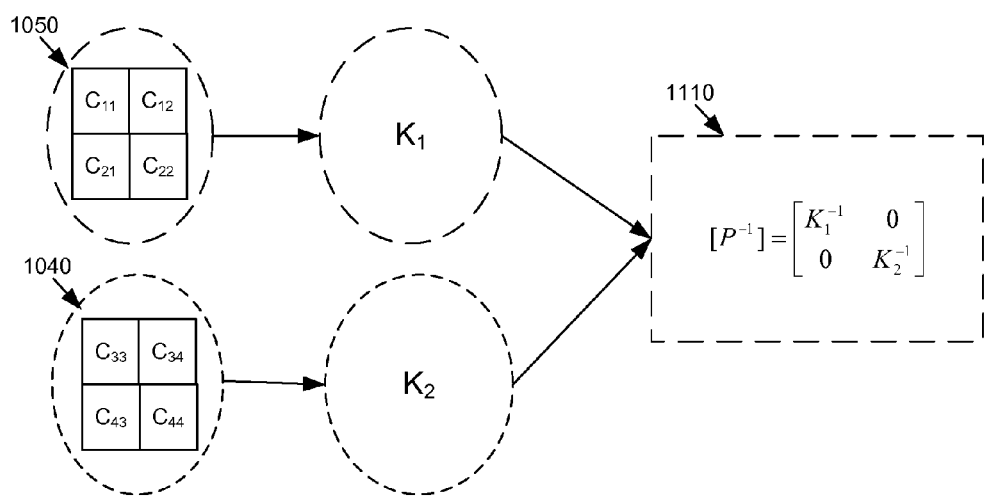
FIG. 11 illustrates preconditioners for each chip of the multi-die design and the virtual segments of FIG. 10.

FIGS. 10 and 11 illustrate constructing a preconditioner from internal nodes and virtual segments. FIG. 10 illustrates the multi-die design of FIG. 8 and its corresponding conductivity matrix 1060, but with the boundary nodes replaced with the virtual segments 1030. In this figure, "1" represents node sets in die 1010 that are completely located within die 1010 respectively and "2" represents node sets in die 1010 that interface with die 1020. Similarly, "4" represents node sets in die 1020 that are completely located within die 1020 and "3" represents node sets in die 1020 that interface with die 1010. In some embodiments, introducing virtual segments simplifies the set of equations and construction of the preconditioner as each die can be viewed as a homogeneous block of internal nodes with the thermal contributions from other dies being accounted for through the virtual segments.

In this manner, the thermal analysis computation is simplified as the processing may now occur in a domain by domain fashion such that the internal nodes for a die represent a domain and the virtual segments connecting the two or more dies represent another domain. This allows for the parallelization of the heat flow computation resulting in reduced runtime for the thermal analysis. For example, a different computational thread processes each domain separately using a different processing unit of a computer system or networked set of computer systems.

FIG. 11 illustrates a preconditioner computed from the conductivity matrix 1050 of the die 1010 and the conductivity matrix 1040 of the die 1020 of FIG. 10. The conductivity values for the virtual segments are known because the virtual segments are abstract objects that may be introduced with any desired conductive property. Ideally, the virtual segment will have high conductivity to represent the fact that the contact points represented by the virtual segment are actually a single shared point between two dies. Accordingly, during preprocessing the values for both the internal nodes and the virtual segments are known and an inverse of these values is computed to derive the preconditioner.

Specifically, some embodiments modify the diagonal terms of the conductivity matrices (e.g., diagonal entries of $C_{22}$ and $C_{33}$ of FIG. 10) to take into account the effect of the virtual segments. For example, if nodes in the node set "2" are connected to nodes in the node set "3" via one or more virtual segments and the thermal conductivity of the virtual segments is k, a term k*A/L will be added to the diagonal entries of the conductivity matrices $C_{22}$ and $C_{33}$ of FIG. 10, where A and L are the cross-sectional area and the height of the virtual segment which are known during preprocessing. Some embodiments then compute the preconditioner for each die 1010 and 1020 by factorizing the conductivity matrices 1040 and 1050 for the dies using Cholesky factorization. The resulting decomposition of the 1040 and 1050 matrices that produce the preconditioners for the dies 1010 and 1020 is shown in FIG. 11.

It should be apparent to one of ordinary skill in the art that some embodiments derive the preconditioners using different heuristics. For example, some embodiments guess values for the inversion of the boundary nodes instead of using the identity matrices. Additionally, it should be apparent to one of ordinary skill in the art that the above described method for constructing the set of equations and the preconditioners apply to circuit designs of any arbitrary size or number of dies.

III. Overall Heat Flow Equation

A. Overall Heat Flow Equation

The overall heat flow equation for modeling the temperature distribution of the entire multi-die design is an equation derived from the sum of its partitioned parts. By combining the set of equations for each die into an overall heat flow equation, the overall heat flow equation is able to account for the interdependencies of the various dies within the multi-die IC design and the package that will contain the IC design. Specifically, the solution of the overall heat flow equation produces a temperature distribution for the entire multi-die design that is dependent upon the configuration of the dies within the multi-die design and the thermal interactions between neighboring dies.

Figure 12:
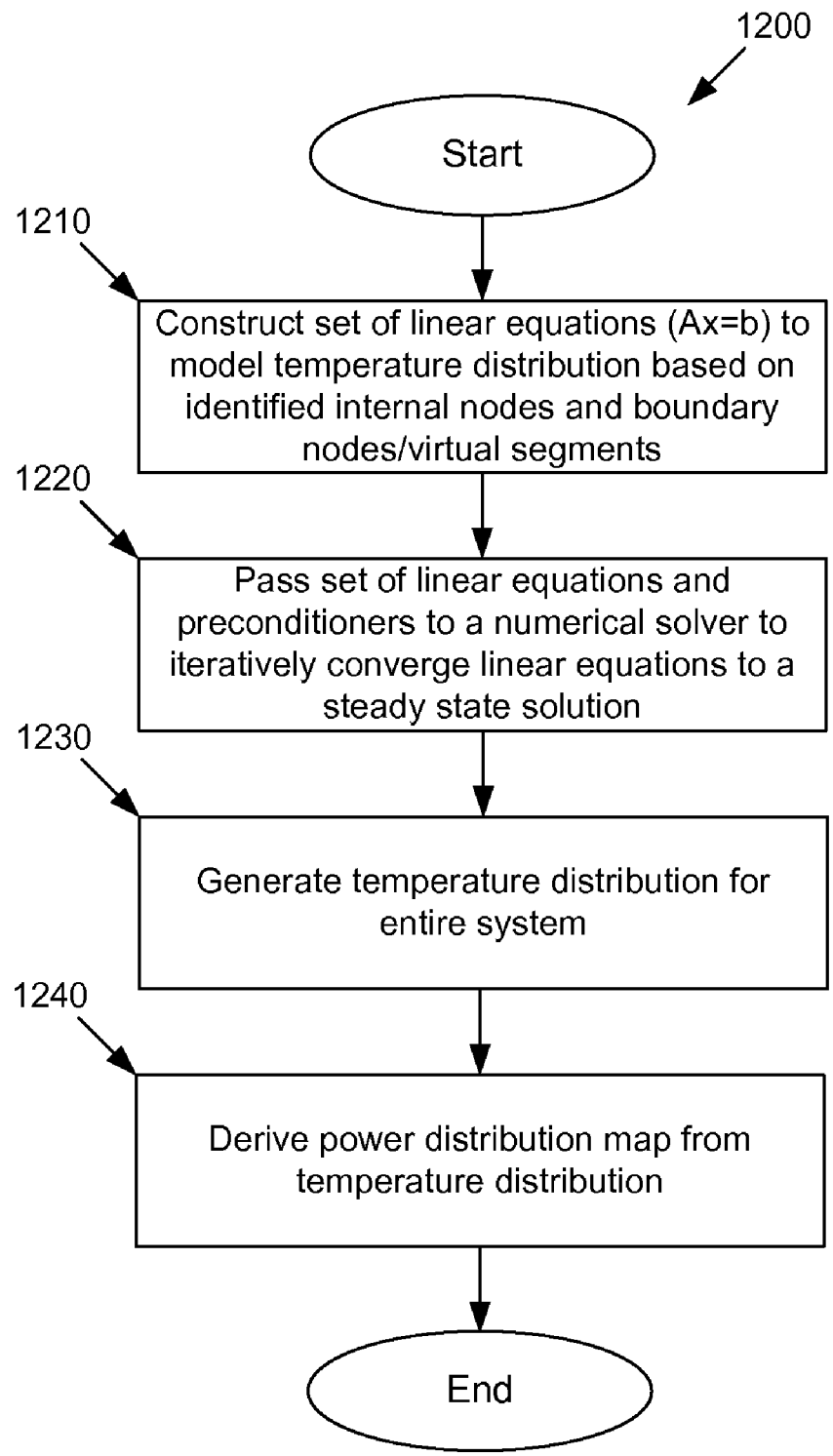
FIG. 12 illustrates a process for modeling the temperature distribution for the entire multi-die design from the preprocessed information of each chip.

FIG. 12 illustrates a process 1200 for modeling the temperature distribution for the entire multi-die design from the preprocessed information of each die. The process 1200 begins by constructing (1210) the overall heat flow equation that models the temperature distribution for the entire multi-die design from the preprocessed information of each die. In some embodiments, the overall flow equation includes a set of matrices and vectors in the form:

$$K*T=b \qquad (5)$$

In this equation, K is a matrix that includes the conductivity matrices from the individual dies, T is a temperature vector that expresses the estimated temperature for different nodes of different dies in the multi-die design and is a function of spatial coordinates x, y, and z given power dissipation values, and b is a vector that is related to the estimated power consumption for different nodes of different dies in the multi-die design.

FIG. 10 above illustrates the formation of the overall heat conduction matrix K for a multi-die IC design from each partial heat conduction matrix representing a die of the IC design. In this figure, the IC design includes a first die 1010 and a second die 1020 with virtual segments 1030 modeling the thermal effects between the dies 1010 and 1020. A first conductivity sub-matrix 1050 is formed from the internal nodes of die 1010 and the virtual segment 1030 and a second conductivity sub-matrix 1040 is formed from the internal nodes of die 1020 and the virtual segment 1030. Together, these various sub-matrices are used to generate the overall heat conduction matrix 1060 used for performing the steady-state thermal analysis of the multi-die IC design.

In constructing the overall heat flow equation at step 1210 of FIG. 12, some embodiments also construct an overall preconditioning matrix that includes each of the preprocessed preconditioning matrices for each separate die of the multi-die design. To construct the overall preconditioning matrix, some embodiments retrieve the preconditioner for each die derived during preprocessing. FIG. 11 illustrates the formation of the overall preconditioning matrix from the conductivity sub-matrices of FIG. 10. Together, these preconditioning sub-matrices create the overall preconditioning matrix 1110 used for performing the steady-state thermal analysis of the multi-die IC design.

After constructing the matrices for the overall system, the process 1200 then employs (at 1220) a numerical iterative solver to solve the set of equations represented by the matrices to converge the sets of equations to a steady state solution vector. Specifically, the numerical iterative solver performs a first set of iterations that (1) determines and updates power dissipation values, (2) calls a second set of iterations that produces a temperature distribution based on the power dissipation values, and (3) determines if the overall system has reached a steady state. If the steady state has not been reached, the first set of iterations is repeated. In some embodiments, the second set of iterations performs the preconditioned conjugate gradient method to produce a temperature distribution (at 1230) for each of the dies in the multi-die design.

Figure 13:
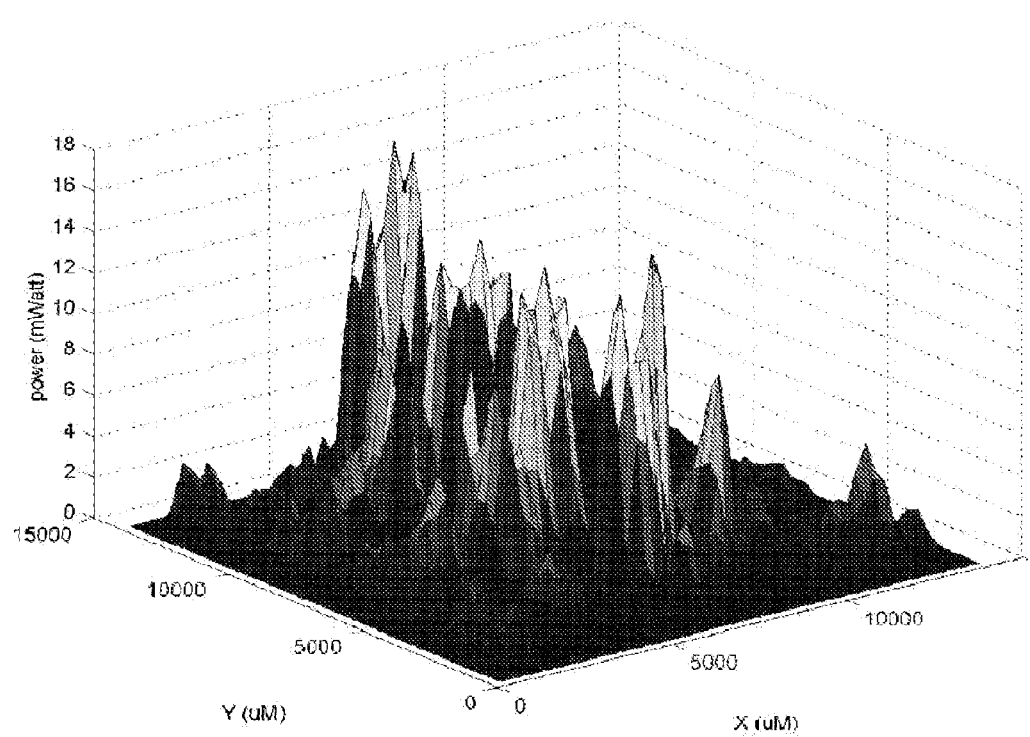
FIG. 13 illustrates a power distribution map.

When the steady state solution is reached, the process uses the resulting temperature distributions to obtain (at 1240) a power distribution map for each of the dies in the design where one such example is illustrated in FIG. 13. The power distribution illustrated in FIG. 13 plots total power consumption in milliwatts as a function of spatial coordinates x, y, z on the IC.

Figure 14:
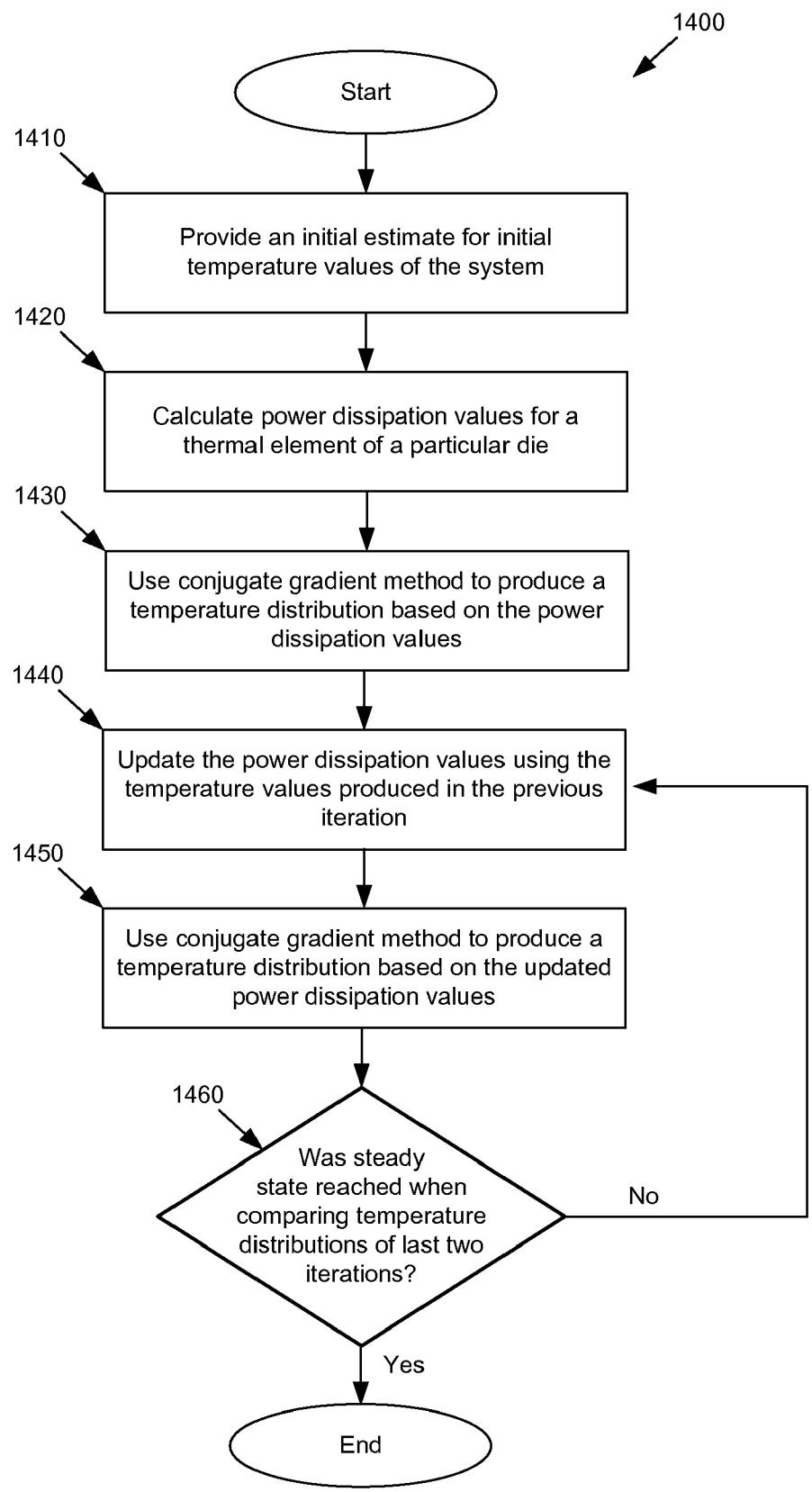
FIG. 14 presents a solving process for iteratively solving the overall heat flow equation for the overall system.

FIG. 14 presents a solving process 1400 using the above described iterations to solve the overall heat flow equation for the overall system. As part of the first set of iterations, the process begins by providing (at 1410) an initial estimate for initial temperature values of the system. The process then calculates (at 1420) the power dissipation values for each of the various thermal elements (e.g., internal nodes, boundary nodes, virtual segments, circuit modules, bricks, etc.) based on the current temperature of the thermal element and its non-linear temperature-dependent power consumption model.

The process uses (at 1430) these power dissipation values in conjunction with the conjugate gradient method (i.e., the second set of iterations) to produce a temperature distribution for the overall system. In the conjugate gradient method, subsequent iterations depend on computations from the prior iteration. In this manner, the temperature vector at a particular iteration in the iterative solving method can be expressed as follows:

$$T_i = f(K*T_{i-1}, b) \qquad (6)$$

where $T_i$ specifies the temperature vector for the current iteration and $T_{i-1}$ specifies the temperature vector for the previous iteration.

The pseudo-code below provides a more detailed description for the iterations performed by the preconditioned conjugate gradient in order to produce a temperature distribution:

$T=T_0$ $r=b-[K]*T_0$ $d=[P^{-1}]*r$ while not converge $$\alpha = (r^T*[P^{-1}]*r)/(d^T*[K]*d)$$

$$T = T + \alpha*d$$

$$r_{new} = r - \alpha*[K]*d$$

$$\beta = (r^T_{new}*[P^{-1}]*r_{new})/(r^T*[P^{-1}]*r)$$

$$d = [P^{-1}]*r_{new} + \beta*d$$

$$r = r_{new}$$

end while

Each resulting temperature distribution comprises a vector of temperature values that correspond to temperatures of the thermal elements of a die in the multi-die design. This distribution provides the steady-state temperature as a function of spatial coordinates given the power dissipation values that were calculated. When nodes are used within the calculation, the spatial coordinates are multi-dimensional spatial coordinates that in some embodiments are represented over x, y, and z dimensions. However, when virtual segments are used within the calculation, the spatial coordinates are only a single dimensional spatial coordinate.

The temperature values produced at 1430 are then used within the first set of iterations to update the power dissipation values. The process calculates the power dissipation of each thermal element again based on the interpolated temperature of the particular thermal element (i.e., the temperature interpolated from the current temperature of its nearby nodes) and its non-linear temperature-dependent power consumption model (e.g., its exponential power consumption model). These new power dissipation values are based on the calculated temperature distribution as opposed to the initial estimated temperature distribution.

The process then uses (at 1450) the power dissipation values calculated at 1440 to again solve the heat flow equation to produce a new temperature distribution. As before, the process uses the preconditioned conjugate gradient method to produce the new temperature distributions. The solution to the heat flow equation is again a vector of temperature values that provide a calculated temperature distribution for the overall system.

The process compares (at 1460) the last two temperature distributions that it obtained by solving the heat flow equation. In some embodiments, the comparison of the two temperature distributions (at 1460) entails a computation of the average difference between the temperature values at each thermal element in the two maps of a particular die divided by the average temperature value on the new map for the particular die. When the average error is within a particular threshold (e.g., less than a predefined threshold), the process ends and outputs the new temperature distribution.

However, when the average error computed at 1460 is not within the threshold, the process 1400 repeats the first and second set of iterations. Specifically, the process uses (at 1440) the new temperature distribution to update the power dissipation values again, uses (at 1450) the new power dissipation values to obtain a new temperature distribution, and then compares (at 1460) the new temperature distribution with the prior temperature distribution to determine whether the average error falls within the predefined threshold.

The process 1400 continues until the difference between two subsequently calculated temperature distributions is small enough that, when compared at 1460, the average error falls below the specified threshold. The solution computed in the final iteration through 1450 is the temperature vector T that represents the temperature distribution across the multi-die IC design.

Some embodiments expedite the processing of the temperature distribution and the reaching of the steady-state solution by leveraging the parallelized nature of the matrices involved in the computations. Specifically, the overall preconditioning matrix is block diagonal. In a multi-threaded environment, each thread performs a computation involving one sub-matrix or block of the preconditioning matrix.

B. Configuration Viability

Some embodiments utilize the resulting temperature distribution to determine the viability of a particular configuration for two or more dies of a multi-die design within a particular package. Also from the resulting temperature distribution, some embodiments determine a configuration that yields an optimal temperature distribution for a particular package.

Figure 15:
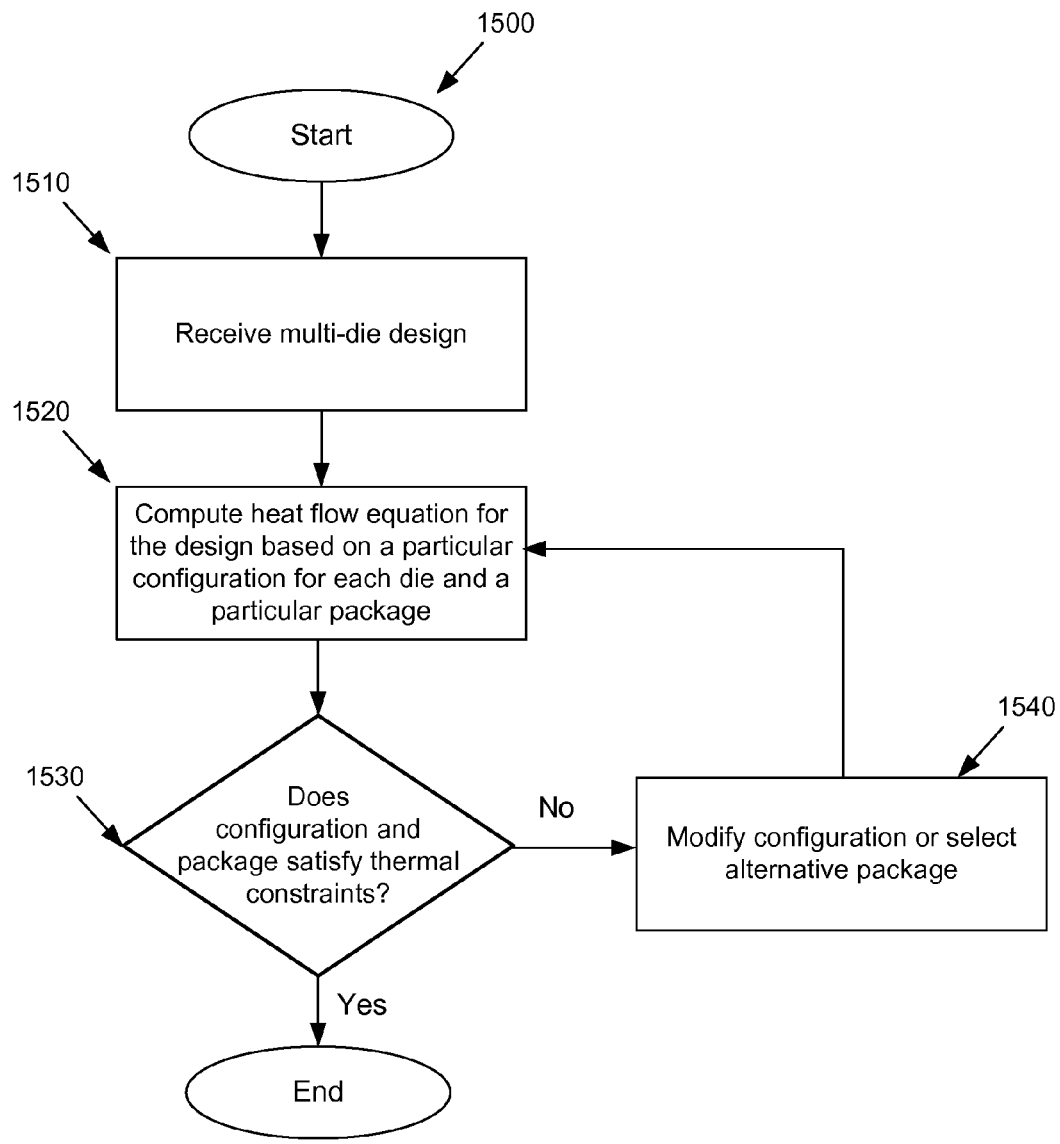
FIG. 15 presents a process for determining the viability of a particular multi-die configuration within a particular package in accordance with some embodiments.

FIG. 15 presents a process 1500 performed by some embodiments that utilizes the derived temperature distribution for the entire multi-die design to determine the viability of a particular multi-die configuration within a particular package. The process 1500 begins by receiving (at 1510) a multi-die design that specifies a particular configuration for the dies of the multi-die design. The process 1500 derives and computes (at 1520) the overall heat flow equation to produce a thermal model for the overall design based on the particular configuration of each die.

Solving the heat flow equation to reach the steady state solution determines (at 1530) whether the operating temperature for the dies exceed specified tolerances. In some embodiments, this determination is made in conjunction with the heat conductance provided by a particular package that may be assisted by passive or active cooling solutions. In other embodiments, the determination is made based on a relative scale where the computed thermal model is quantified and resulting values are used to determine whether the thermal model exceeds a predetermined value. In some embodiments, the relative scale specifies various thresholds for different packages that if exceeded render the design not viable.

If the thermal model satisfies specified heat constraints, the multi-die design, specifically the particular configuration of the dies within the design, is operationally viable and the process ends. However, if the thermal model does not satisfy specified heat constraints, then the particular configuration of the dies within the multi-die is not viable (i.e., may suffer from thermal runaway). In such situations, some embodiments select (at 1540) an alternative configuration for the multiple dies to better distribute heat across the design in order to cure the thermal limitations that restrict the implementation of the multi-die design. Alternatively, some embodiments select (at 1540) an alternative package to better conduct heat away from the configuration in order to cure the thermal limitations that restrict the implementation of the multi-die design. It should be apparent to one of ordinary skill in the art that the selection of the alternate configuration or the selection of the alternate package performed at 1540 is an operation that in some instances is performed by some embodiments of the invention and in other instances is an operation performed by the layout designer in response to a notification raised by the process 1500 at 1540.

Figure 16:
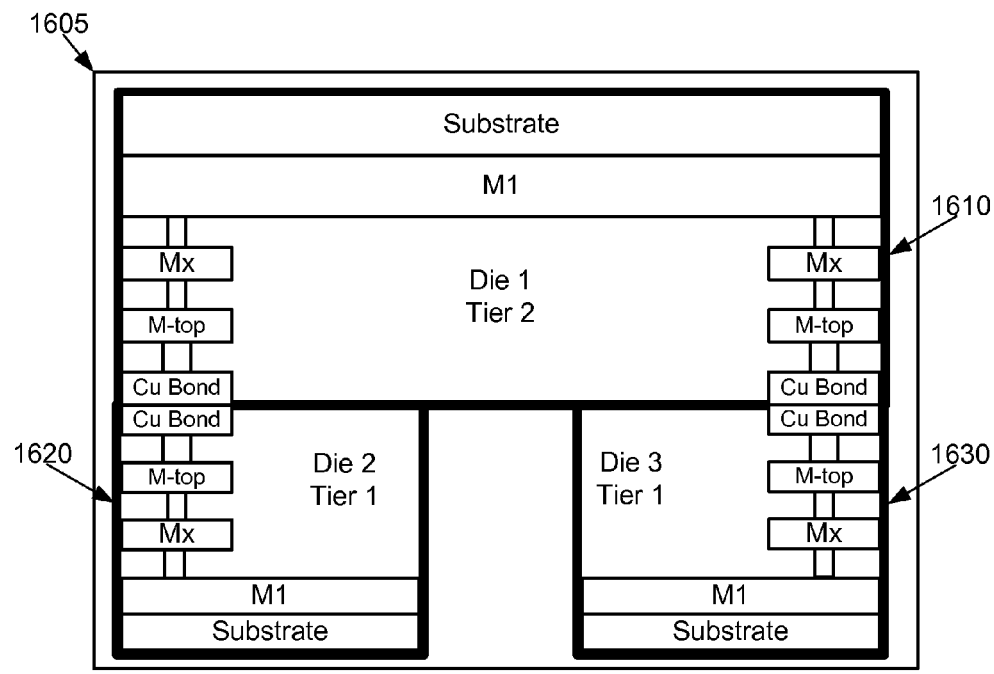
FIG. 16 illustrates a possible configuration for multiple chips of a multi-die design.

FIG. 16 illustrates a possible configuration 1605 for multiple dies of a multi-die design within a particular package. In this figure, the configuration 1605 specifies three dies 1610, 1620, and 1630 that are arranged in two tiers. A first die 1610 is stacked on top (i.e., on different layers than of an IC) dies 1620 and 1630. When placed within the particular package, a large amount of heat produced by dies 1620 and 1630 will be passed to die 1610 before the heat is conducted away by the package. Therefore, the majority of the heat will be distributed directly above the surface of chip 1610.

Figure 17:
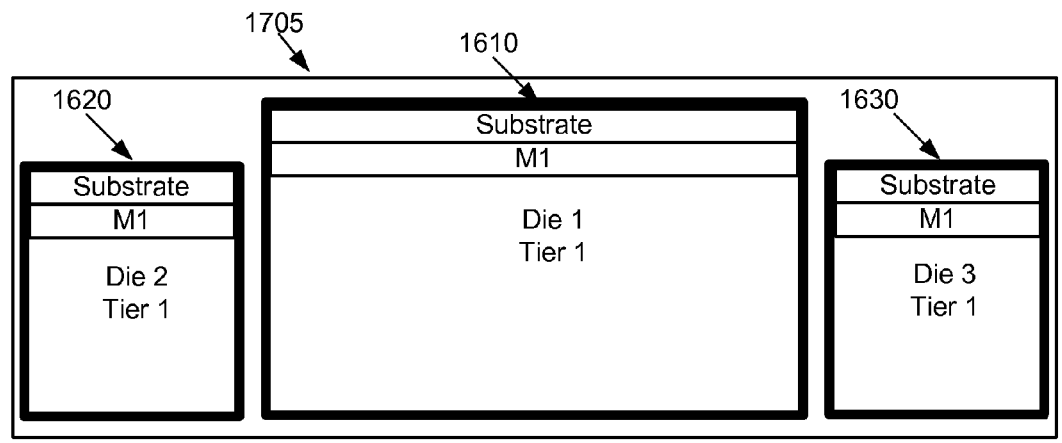
FIG. 17 presents an alternative configuration for the multiple chips of the multi-die design illustrated in FIG. 16.

FIG. 17 presents an alternative configuration 1705 for the multiple dies of the multi-die design illustrated in FIG. 16. In this figure, the configuration 1705 places the dies 1610, 1620, 1630 in a horizontal arrangement within a package as opposed to the vertical arrangement shown in FIG. 16. Though the configuration 1705 of FIG. 17 occupies more area along a horizontal axis, the configuration 1705 also provides a more even heat distribution as each die can conduct heat to the package as opposed to the configuration 1605 of FIG. 16 where a large amount of heat from dies 1620 and 1630 passes through die 1610 before exiting the package. Therefore, it is likely that the configuration 1705 of FIG. 17 runs cooler than the configuration 1605 of FIG. 16. In some instances, the computed thermal model at 1520 will reveal that the configuration 1705 satisfies the thermal constraints imposed on the multi-chip design and the selected package and is thus a viable solution.

IV. Computer System

Many of the above-described processes are implemented as software processes that are specified as a set of instructions recorded on a machine readable medium (also referred to as computer readable medium). When these instructions are executed by one or more computational element(s) (such as processors or other computational elements like ASICs and FPGAs), they cause the computational element(s) to perform the actions indicated in the instructions. Computer is meant in its broadest sense, and can include any electronic device with a processor. Examples of computer readable media include, but are not limited to, CD-ROMs, flash drives, RAM chips, hard drives, EPROMs, etc.

In this specification, the term "software" is meant in its broadest sense. It can include firmware residing in read-only memory or applications stored in magnetic storage which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention.

Figure 18:
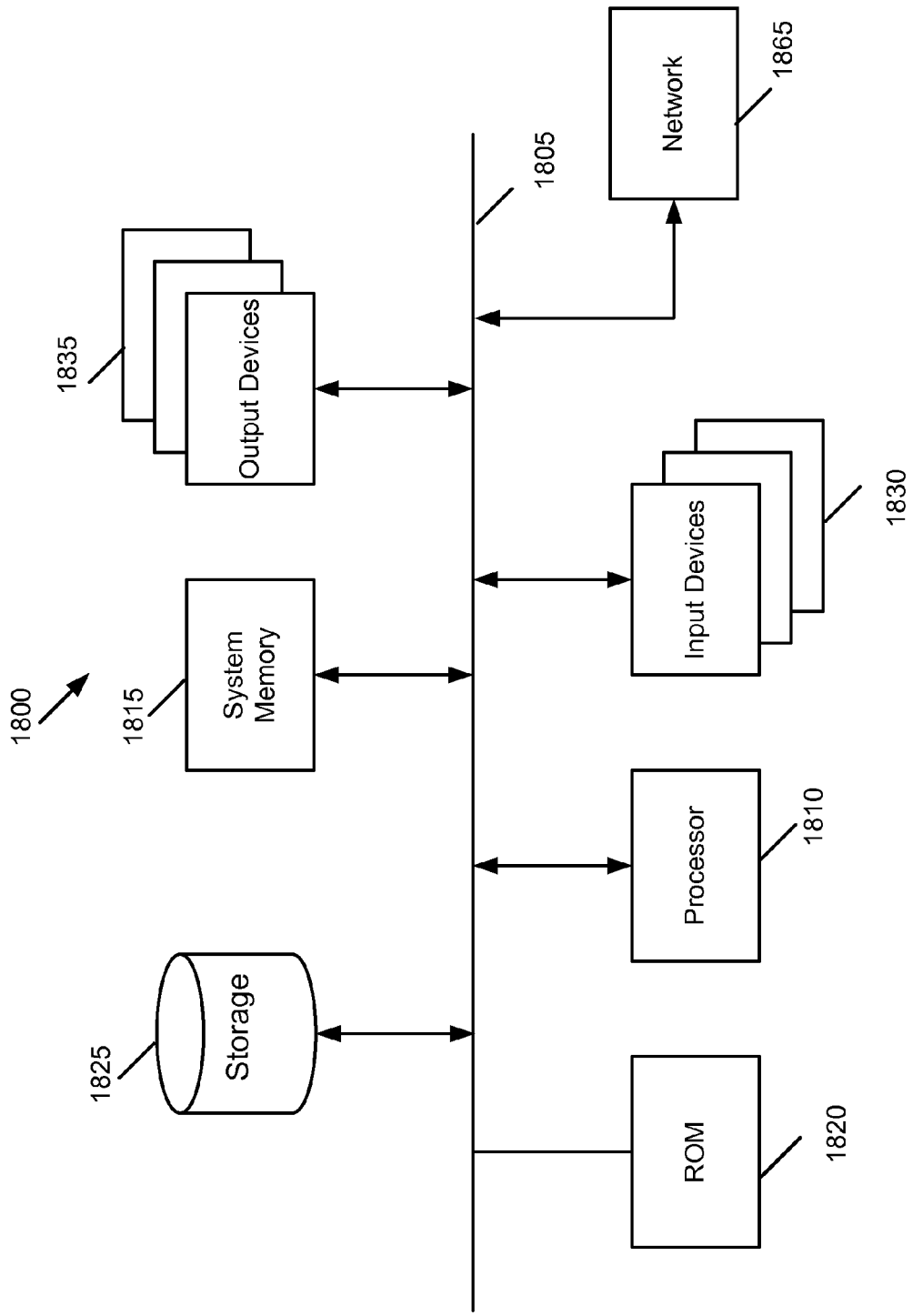
FIG. 18 conceptually illustrates a computer system with which some embodiments of the present invention are implemented.

FIG. 18 conceptually illustrates a computer system with which some embodiments of the present invention are implemented. Computer system 1800 includes a bus 1805, a processor 1810, a system memory 1815, a read-only memory 1820, a permanent storage device 1825, input devices 1830, and output devices 1835.

The bus 1805 collectively represents all system, peripheral, and chipset buses that communicatively connect the numerous internal devices of the computer system 1800. For instance, the bus 1805 communicatively connects the processor 1810 with the read-only memory 1820, the system memory 1815, and the permanent storage device 1825.

From these various memory units, the processor 1810 retrieves instructions to execute and data to process in order to execute the processes of the invention. Due to the parallelized nature of the various processes and computations, some embodiments execute the various processes and computations in a multi-threaded environment. The read-only memory 1820 stores static data and instructions that are needed by the processor 1810 and other modules of the computer system. The permanent storage device 1825, on the other hand, is a read-and-write memory device. This device is a non-volatile memory unit that stores instructions and data even when the computer system 1800 is off. Some embodiments of the invention use a mass-storage device (such as magnetic or optical disk and its corresponding disk drive) as the permanent storage device 1825. Other embodiments use a removable storage device (such as a floppy disk, and its corresponding disk drive) as the permanent storage device.

Like the permanent storage device 1825, the system memory 1815 is a read-and-write memory device. However, unlike storage device 1825, the system memory 1815 is a volatile read-and-write memory, such as a random access memory. The system memory stores some of the instructions and data that the processor needs at runtime. In some embodiments, the invention's processes are stored in the system memory 1815, the permanent storage device 1825, and/or the read-only memory 1820.

The bus 1805 also connects to the input and output devices 1830 and 1835. The input devices enable the user to communicate information and select commands to the computer system. The input devices 1830 include alphanumeric keyboards and cursor-controllers.

The output devices 1835 display images generated by the computer system. For instance, these devices might display a three-dimensional temperature map. The output devices include printers and display devices such as cathode-ray tubes or liquid crystal displays.

Finally, as illustrated in FIG. 18, the bus 1805 also couples computer 1800 to a network 1840 through a network adapter (not shown). In this manner, the computer can be part of a network of computers (such as a local area network, a wide area network, or an intranet) or a network of network (such as the Internet).

Any or all of the components of computer system 1800 may be used in conjunction with the invention. However, one of ordinary skill in the art would appreciate that any other system configuration may also be used in conjunction with the present invention.

While the invention has been described with reference to numerous specific details, one of ordinary skill in the art will recognize that the invention can be embodied in other specific forms without departing from the spirit of the invention. For instance, the process 1200 computes two power dissipation values of each circuit module at two temperatures and then derives coefficients for the non-linear heat source model from these two values. In other embodiments, the process 1200 might receive the coefficients of the non-linear leakage power model for a circuit module from a manufacturer or a developer of a circuit library. In such a situation, the process 1200 might then only need one to compute one power dissipation value for a circuit module to formulate its heat flow equation.

Also, several embodiments described above treat only leakage power as the power dissipation component that is dependent on the temperature. As mentioned above, the total power dissipation in an IC is made up of leakage power, switching power, and internal power of the various circuit modules. Other embodiments may treat other components of the power dissipation (e.g., switching power and internal power) as temperature dependent components. The temperature dependence of these other components might be specified through an exponential model or some other model. Thus, one of ordinary skill in the art would understand that the invention is not to be limited by the foregoing illustrative details, but rather is to be defined by the appended claims.

The invention claimed is:

1. A method for performing thermal analysis of an integrated circuit (IC) design comprising a plurality of dies, the method comprising:
    defining a thermal element comprising a set of virtual segments and a set of nodes at a boundary of a first die and a second die in the plurality of dies, each virtual segment representing an extrapolation of a boundary node at a contact point between the first and second dies, each boundary node logically extrapolated into an internal node of the first die and an internal node of the second die;
    defining a heat flow equation that accounts for thermal interactions between the first and second dies at a set of contact points represented by a set of boundary nodes based on a particular arrangement of the first and second dies and said thermal element; and
    by a computer, solving the heat flow equation to obtain a temperature distribution that accounts for said thermal interactions.

2. The method of claim 1 further comprising determining at least one preconditioner obtained from one of the first and second dies.

3. The method of claim 2, wherein the preconditioner of each particular die is determined from a set of thermal elements of the particular die.

4. The method of claim 3, wherein the set of thermal elements of each particular die comprises at least one thermal conductive segment between the particular die and another die to model thermal effects between the particular die and said another die.

5. The method of claim 4, wherein the thermal conductive segment models the temperature distribution at contact points connecting the particular die and said another die.

6. The method of claim 4, wherein the set of thermal elements of each die further comprises internal thermal elements at a plurality of locations within the die for modeling thermal effects from thermal sources internal to the die, wherein each internal thermal element comprises a three dimensional space over which thermal effects from at least one thermal source are accounted for.

7. The method of claim 1 further comprising defining a preconditioner to accelerate convergence when solving the heat flow equation, wherein solving the heat flow equation comprises applying said preconditioner to the heat flow equation.

8. The method of claim 7, wherein applying the preconditioner to accelerate convergence comprises reducing a number of iterations required to converge the heat flow equation to a solution, wherein the solution specifies a steady temperature state for each die of the IC design.

9. The method of claim 1, wherein said temperature distribution comprises a thermal map for each die in the IC design.

10. The method of claim 1, wherein solving the heat flow equation comprises iteratively (i) identifying a temperature distribution for the IC design as a current temperature distribution, (ii) based on the current temperature distribution, computing temperature-dependent power dissipation values for thermal elements in the IC design, (iii) solving the heat flow equation for the computed power-dissipation values in order to identify a new current temperature distribution for the IC design, and (iv) terminating the iterations after determining a convergence of the identified temperature distributions.

11. The method of claim 1, wherein the virtual segments represent highly conductive abstract connections that account for the thermal interactions at contact points between at least two dies over a single dimension.

12. A non-transitory computer readable medium storing a computer program which when executed by at least one processor performs thermal analysis of an integrated circuit (IC) design comprising a plurality of dies for execution, the computer program comprising sets of instructions for:
    defining a thermal element comprising a set of virtual segments and a set of nodes at a boundary of a first die and a second die in the plurality of dies, each virtual segment representing an extrapolation of a boundary node at a contact point between the first and second dies, each boundary node logically extrapolated into an internal node of the first die and an internal node of the second die;
    defining a heat flow equation that accounts for thermal interactions between the first and second dies at a set of contact points represented by a set of boundary nodes based on a particular arrangement of the first and second dies and said thermal element; and
    solving the heat flow equation to obtain a temperature distribution that accounts for said thermal interactions.

13. The non-transitory computer readable medium of claim 12, wherein the computer program further comprises a set of instructions for determining at least one preconditioner obtained from one of the first and second dies.

14. The non-transitory computer readable medium of claim 13, wherein the preconditioner of each particular die is determined from a set of thermal elements of the particular die.

15. The non-transitory computer readable medium of claim 14, wherein the set of thermal elements of each particular die comprises at least one thermal conductive segment between the particular die and another die to model thermal effects between the particular die and said another die.

16. The non-transitory computer readable medium of claim 15, wherein the set of thermal elements of each die further comprises internal thermal elements at a plurality of locations within the die for modeling thermal effects from thermal sources internal to each die, each internal thermal element comprising a three dimensional space to account for thermal effects from at least one thermal source.

17. A system comprising:
    at least one processor for executing sets of instructions; and
    a memory storing a computer program for performing thermal analysis of an integrated circuit (IC) design comprising a plurality of dies, the computer program comprising sets of instructions to be executed by the processor for:
    defining a thermal element comprising a set of virtual segments and a set of nodes at a boundary of a first die and a second die in the plurality of dies, each virtual segment representing an extrapolation of a boundary node at a contact point between the first and second dies, each boundary node logically extrapolated into an internal node of the first die and an internal node of the second die;
    defining a heat flow equation that accounts for thermal interactions between the first and second dies at a set of contact points represented by a set of boundary nodes based on a particular arrangement of the first and second dies and said thermal element; and
    solving the heat flow equation to obtain a temperature distribution that accounts for said thermal interactions.

18. The system of claim 17, wherein the computer program further comprises a set of instructions for defining a preconditioner for at least a particular die determined from a set of thermal elements of the particular die to accelerate convergence when solving the heat flow equation, wherein solving the heat flow equation comprises applying said preconditioner to the heat flow equation.

19. The system of claim 18, wherein the set of instructions for applying the preconditioner to accelerate convergence comprises a set of instructions for reducing a number of iterations required to converge the heat flow equation to a solution specifying a steady temperature state for each die of the IC design.

20. The method of claim 17, wherein the set of instructions for solving the heat flow equation comprises sets of instructions for iteratively (i) identifying a temperature distribution for the IC design as a current temperature distribution, (ii) based on the current temperature distribution, computing temperature-dependent power dissipation values for thermal elements in the IC design, (iii) solving the heat flow equation for the computed power-dissipation values in order to identify a new current temperature distribution for the IC design, and (iv) terminating the iterations after determining a convergence of the identified temperature distributions.

* * * * *